United States Patent [19]

Knudsen

[11] Patent Number: 5,734,261
[45] Date of Patent: Mar. 31, 1998

[54] INPUT PROTECTION CIRCUIT WHICH INCLUDES OPTOCOUPLER PROTECTION DURING OVER-VOLTAGE CONDITIONS

[75] Inventor: Niels Knudsen, Austin, Tex.

[73] Assignee: National Instruments Corporation, Austin, Tex.

[21] Appl. No.: 740,963

[22] Filed: Nov. 5, 1996

[51] Int. Cl.$^6$ ............................................. G05F 5/08
[52] U.S. Cl. ................................................. 323/908
[58] Field of Search ........................... 323/274, 276, 323/277, 278, 299, 303, 312, 315, 231, 908; 307/318

[56] References Cited

U.S. PATENT DOCUMENTS

| | | | |
|---|---|---|---|
| 5,268,631 | 12/1993 | Gorman | 323/908 |
| 5,479,090 | 12/1995 | Schultz | 323/284 |
| 5,541,500 | 7/1996 | Krahl | 323/299 |

*Primary Examiner*—Aditya Krishnan
*Attorney, Agent, or Firm*—Conley, Rose & Tayon; Jeffrey C. Hood

[57] ABSTRACT

An input protection circuit for an instrumentation system which receives an input signal and which is adapted for providing a current and/or voltage limited version of the input signal to a measurement system. The input protection circuit of the present invention utilizes an optocoupler and also includes circuitry which protects the optocoupler from damage if an over-voltage condition is detected. The input protection circuit includes a comparator which is operable to disable or turn off the optocoupler when the current limited version of the input signal exceeds a preset value. The input protection circuit preferably includes a resistor connected in parallel with the optocoupler, which provides an alternative path for the input signal when the optocoupler has been cut off. The present invention thus provides an improved input protection circuit which also protects the optocoupler from damage if an over-voltage condition is detected, but still allows the input signal to be measured during this time.

20 Claims, 6 Drawing Sheets

INPUT PROTECTION CIRCUIT WHICH INCLUDES OPTOCOUPLER PROTECTION DURING OVER-VOLTAGE CONDITIONS

FIELD OF THE INVENTION

The present invention relates to conditioning signals to provide voltage input protection, and more particularly to an input voltage protection circuit which utilizes an optocoupler to provide input protection and which also includes a comparator which disables the optocoupler when an over-voltage condition is detected.

DESCRIPTION OF THE RELATED ART

Scientists and engineers often use measurement or instrumentation systems to perform a variety of functions, including laboratory research, process monitoring and control, data logging, analytical chemistry, test and analysis of physical phenomena, and control of mechanical or electrical machinery, to name a few examples.

An instrumentation system typically includes transducers and other detecting means for providing "field" electrical signals representing a process, physical phenomena, equipment being monitored or measured, etc. For example, detectors and/or sensors are used to sense the on/off state of power circuits, proximity switches, pushbutton switches, thermostats, relays or even the presence of positive or negative digital logic-level signals. The instrumentation system further includes interface hardware for receiving the measured field signals and providing them to a processing system, such as a personal computer. The processing system typically performs data analysis and presentation for appropriately analyzing and displaying the measured data.

Often, the field signals may be coupled to high common-mode voltages, ground loops, or voltage spikes that often occur in industrial or research environments which could damage the computer system. In that case, the instrumentation system typically includes isolation circuitry, such as optocouplers, for eliminating ground-loop problems and isolating the computer from potentially damaging voltages. Digital signal input modules are typically provided for conditioning the raw field voltage signals by amplifying, isolating, filtering or otherwise converting the signals to the appropriate digital signals for the computer system. In one embodiment, the digital signals are then provided to a plug-in data acquisition (DAQ) input/output (I/O) board, which is plugged into one of the input/output (I/O) slots of a computer system.

FIG. 1 illustrates a simple voltage protection circuit according to the prior art. As shown, an input or field signal referred to as IN is provided to the input of the voltage protection circuit. The voltage input protection circuit includes a current limiting resistor 80, or other type of current limiting device. The anode of a first diode 82 and the cathode of a second diode 82 are coupled to the other end of the current limiting resistor 80. The diodes 82 operate to conduct current when a certain threshold is reached. The IN signal is provided through the current limiting resistor 80 to an input of an operational amplifier (op amp). The output of the op amp 84 provides an output signal referred to as OUT.

However, one problem with the voltage protection circuit of FIG. 1 is that the resistor 80 is prone to overheating. Thus the voltage protection circuit of FIG. 1 can only withstand high voltages for a very limited time.

There are generally two measures of the quality of an input protection circuit, these being the added resistance and the amount of voltage protection. A first measure of the quality of an input protection circuit is the resistance added to the connection path by the input protection circuit. It is desirable for an input protection circuit to provide minimal resistance to the path in which it is connected. The input protection circuit shown in FIG. 1 adds a considerable amount of resistance to the input path of the signal being measured, and thus is undesirable. This large amount of resistance limits the bandwidth of the circuit due to added capacitance.

A second measure of the quality of an input protection circuit is the amount of voltage that the input protection circuit is capable of protecting for before the protection breaks down. One problem with current input protection circuits which use current limiting devices is that, if the amount of voltage that can be protected for is exceeded, referred to as an over-voltage condition, the current limiting device is damaged and thus no longer usable.

Therefore, it is desired to provide an improved input protection circuit which provides improved voltage protection and isolation for input signals. It is further desired to provide an improved input protection circuit which also protects the current limiting device from damage if an over-voltage condition is detected, but still allows the input signal to be measured.

SUMMARY OF THE INVENTION

The present invention comprises an input protection circuit which receives an input signal and which is adapted for providing a current and/or voltage limited version of the input signal to a measurement system. The input protection circuit of the present invention utilizes an optocoupler and also includes circuitry which protects the optocoupler from damage if an over-voltage condition is detected while still allowing the input signal to be measured. The present invention provides a current limiting device that protects the input voltage limiter and input amplifier for a very short time, and operates to disconnect to protect the circuitry from overheating.

The input protection circuit includes a photo MOSFET which receives the input signal, performs a current limiting and/or voltage limiting function, and provides a current limited version of the input signal. A comparator is coupled to the output of the optocoupler and receives the current limited version of the input signal. The comparator is operable to disable or turn off the optocoupler when the current limited version of the input signal exceeds a preset value. The input protection circuit preferably includes a resistor connected in parallel with the optocoupler. The resistor preferably has a large value and is included to provide the measurement system with the ability to monitor and record the signal being measured after the optocoupler has been cut off. The input protection circuit preferably further includes one or more diodes and/or resistors which limit the value of the output signal provided to the measurement system.

In performing the current and/or voltage limiting function, the optocoupler can become damaged if the voltage or current of the input signal is too high. When the current and/or voltage passing through the optocoupler exceeds a preset threshold, the comparator generates a signal to the disable input of the optocoupler to turn off the optocoupler. This operates to protect the optocoupler from being damaged if an over-voltage condition occurs. When the optocoupler is turned off, the signal being measured is now provided through the resistor instead of the optocoupler. Thus the measurement system is still able to record and/or measure the input signal, even after the optocoupler has been shut off. The optocoupler is mined back on when the current and/or voltage goes below the comparator threshold. After the optocoupler is turned back on, the optocoupler operates normally.

As discussed in the background section, one problem with prior art input protection circuits which use current limiting devices is that, if the amount of voltage that can be protected for is exceeded, referred to as an over-voltage condition, the current limiting device is damaged and thus no longer usable. The present invention provides an improved input protection circuit which also protects the current limiting device from damage if an over-voltage condition is detected, but still allows the input signal to be measured.

In one embodiment, when the comparator generates a signal to turn off the optocoupler, the comparator also generates an interrupt to the computer system to indicate that this condition has occurred. The interrupt informs the computer system that the signal being measured is now being provided through a much larger resistance, and thus some degradation can be expected.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
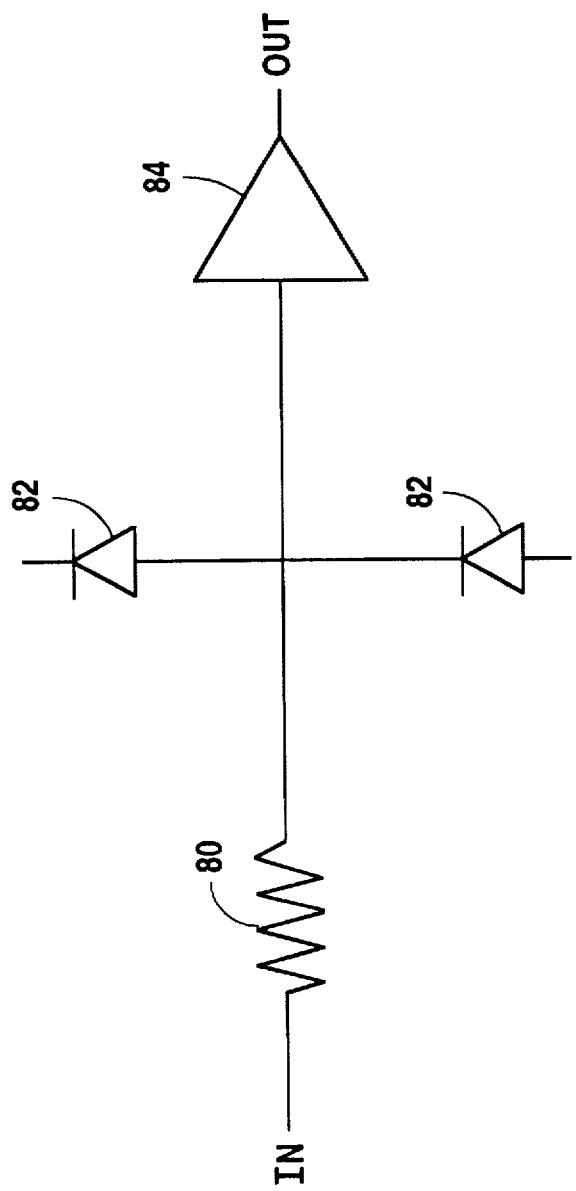
FIG. 1 illustrates a simple input voltage protection circuit according to the prior art.
Figure 2A:
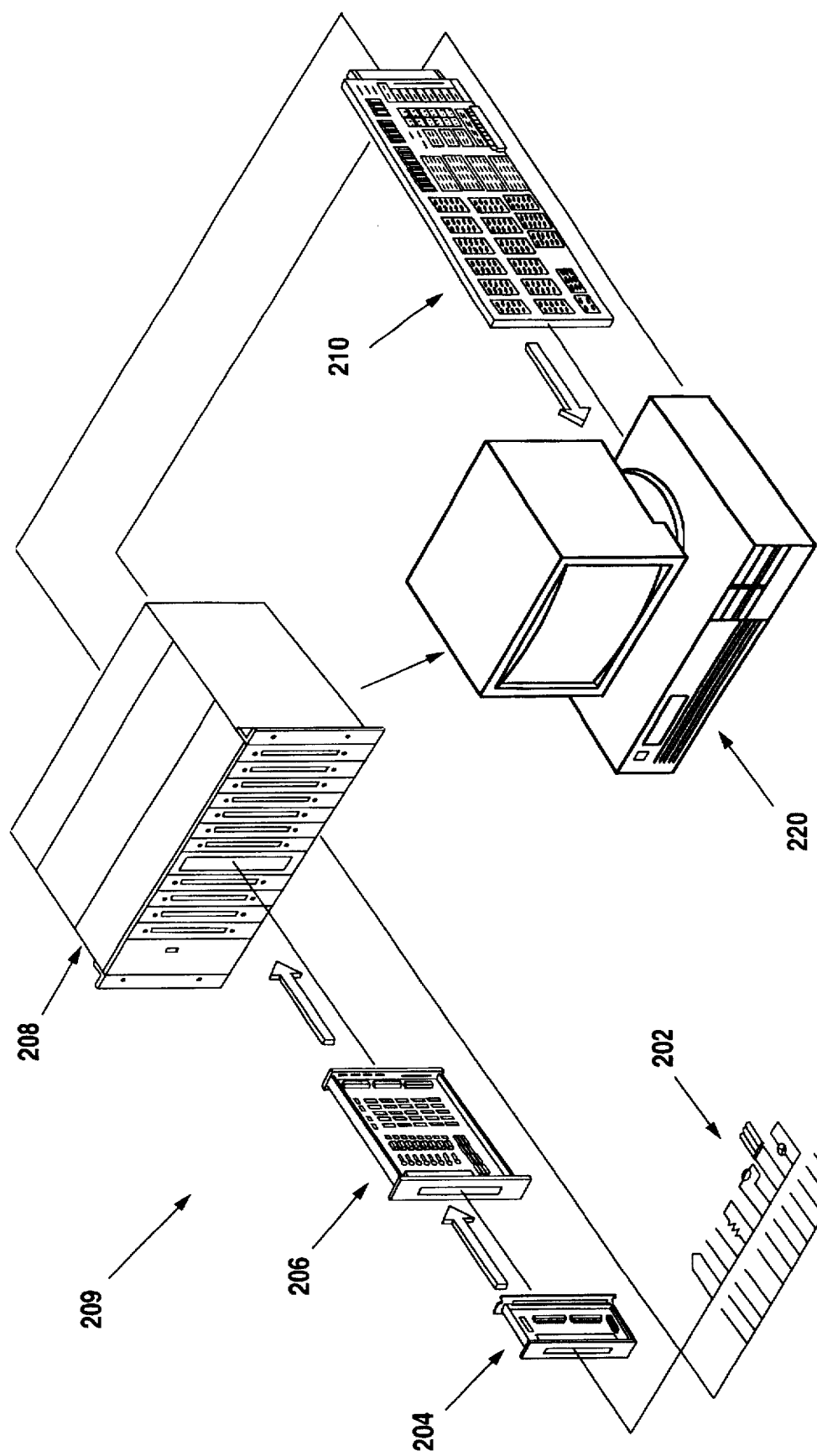
FIGS. 2A and 2B illustrate an instrumentation system including a signal conditioning system according to the present invention.
Figure 2B:
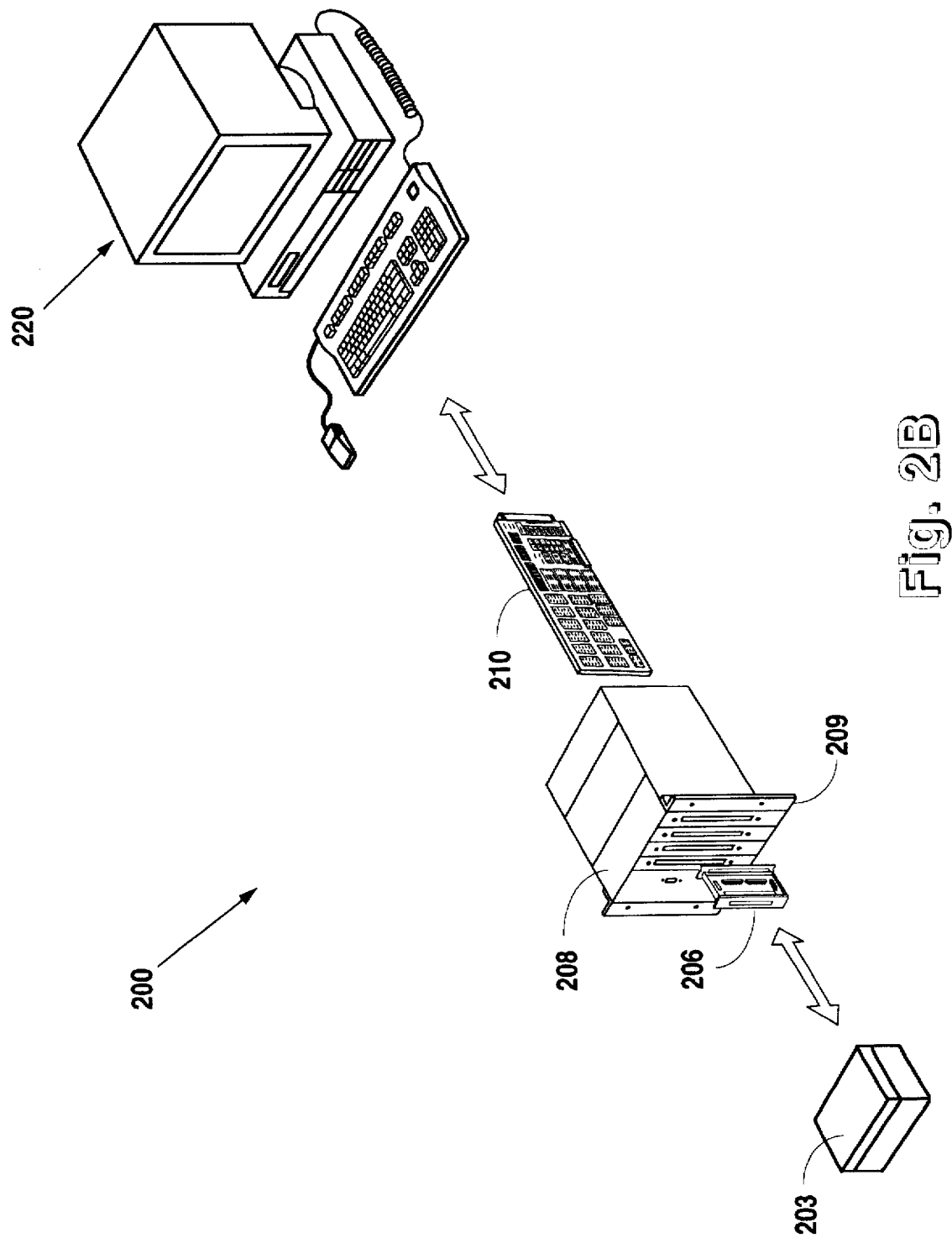

FIGS. 2A and 2B each illustrate an instrumentation system 200 incorporating a signal conditioning module according to the present invention. The instrumentation system 200 shown in each of FIGS. 2A and 2B is a computer-based data acquisition system. The instrumentation system 200 of FIG. 2A is shown including one or more signals and transducers 202 for sensing real world phenomena or a unit under test (UUT) 203 (FIG. 2B). The instrumentation system 200 of FIG. 2B is shown coupled to detect signals from a unit under test.

The unit under test (UUT) 203 generally represents a process or other physical phenomena being monitored, including transducers or other sensing devices for detecting or measuring temperature, pressure, or voltage, etc. For example, it may be desired to sense the on/off state of power circuits, proximity switches, pushbutton switches, thermostats, relays or the presence of positive or negative digital logic-level signals.

As shown in FIG. 2A, the sensing devices or transducers 202 provide field signals to SCXI (Signal Conditioning extensions for Instrumentation) shielded terminal blocks 204. The SCXI terminal blocks 204 couple to a signal conditioning system 209. The signal conditioning system 209 comprises an SCXI module 206 comprised in an SCXI chassis 208. The SCXI module 206 is shown external to the SCXI chassis 208 for illustrative purposes.

The signal conditioning system 209 isolates the field signals and selectively amplifies, reduces, or filters the field signals. The signal conditioning system 209 provides corresponding output signals to a data acquisition (DAQ) board 210, which is further coupled to a computer system 220 through its input/output (I/O) bus 222. The DAQ board 210 is preferably an expansion card comprised in the computer system 220, but is shown external to the computer system 220 for illustrative purposes.

The signal conditioning system or SCXI system 209, which includes SCXI chassis 208 comprising one or more SCXI modules 206, is an instrumentation front end for DAQ boards optimized for low level analog signal conditioning, amplification, and filtering. The one or more SCXI modules 206 are housed in the SCXI chassis 208 and operate to multiplex all signals to one channel, thus enabling one cable to be used to connect the SCXI system 209 to the DAQ board 210.

The SCSI module 206 provides only high level signals to the computer system 220, thus reducing the effects of the noisy computer environment on the measurements being made. In one embodiment, SCXI module 206 includes input protection circuitry according the present invention. In another embodiment, the input protection circuitry according to the present invention is comprised on the DAQ board 210. The input protection circuitry according to the present invention may be comprised in other logic components, or may be used in other applications, as desired.

The DAQ board 210 includes the appropriate circuitry for collecting all of the data provided by the signal conditioning system 209 and providing this data on the I/O bus 222 of the computer system 220. The computer system 220 includes the appropriate software for performing analysis of the collected data and a display 214 for displaying the analyzed data in a desirable format. The computer system 220 preferably utilizes LabVIEW software from National Instruments Corporation.

In the preferred embodiment, the signal conditioning system 209 includes a plurality of channels where each channel receives a field signal from the transducers 202 or UUT 203. The field signals may have different forms based on voltage and current levels as well as polarity. For example, the field signals could be digital logic signals such as TTL and CMOS, or could be AC or DC signals with large voltage levels. Where the field signals include high common-mode voltages, these signals must be isolated from the computer system 220. Thus, the signal conditioning system 209 isolates the field signals to eliminate ground-loop problems which would otherwise expose the computer system 220 to high voltages. As mentioned above, the signal conditioning system 209 or the DAQ board 210 includes input protection circuitry according to the present invention.

Figure 3:
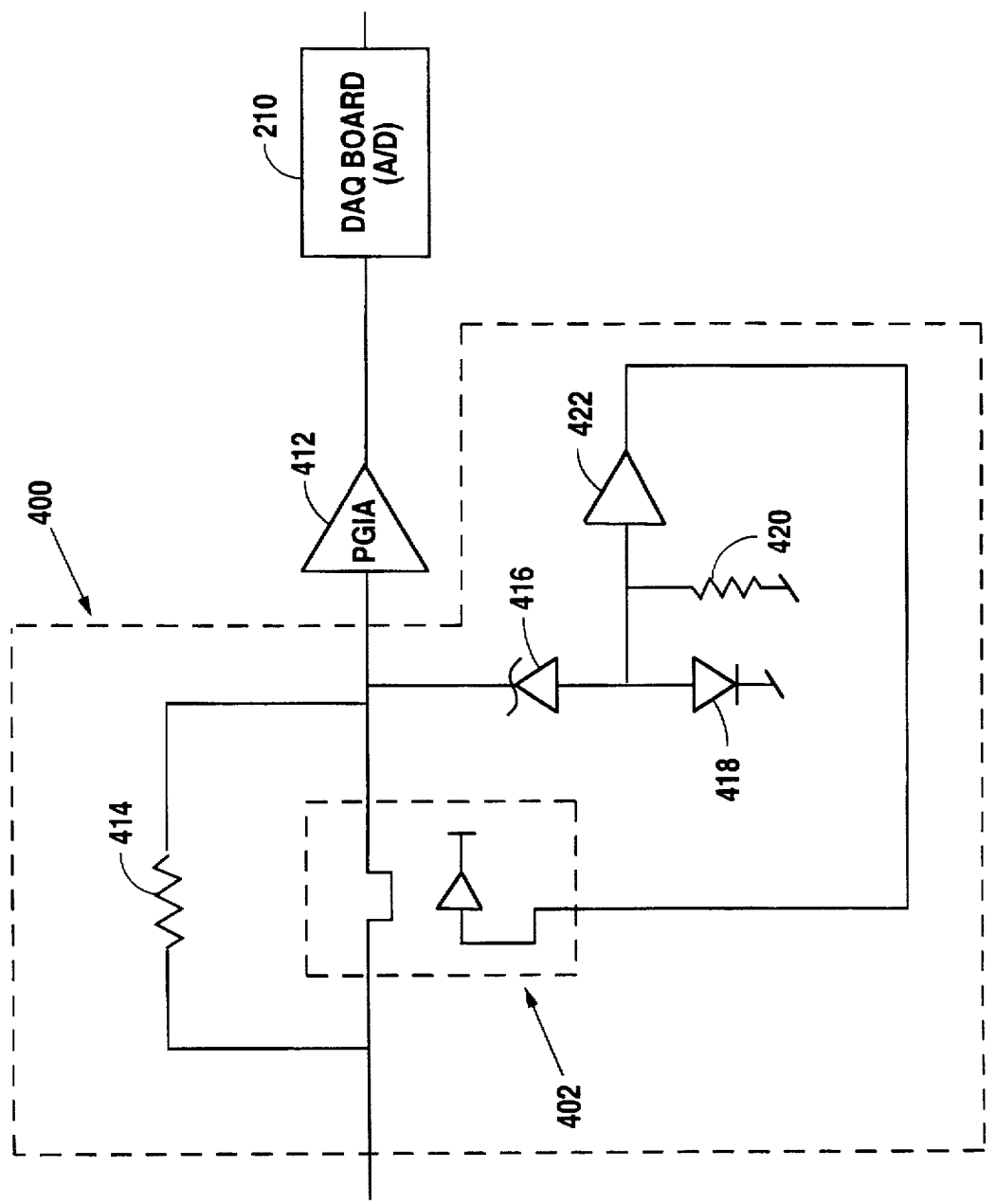
FIG. 3 is a more detailed schematic diagram of an input port of the signal conditioning system of FIG. 2 including input voltage protection circuitry according to the present invention.

FIG. 3—Input Protection Circuit

Referring now to FIG. 3, a schematic diagram is shown illustrating the input protection circuit of the present invention. In the preferred embodiment, the input protection circuit is comprised on the DAQ board 210. In an alternate embodiment, the input protection circuit 400 is comprised in SCXI module 206.

As shown in FIG. 3, an input signal IN provided from the transducers 202 or the UUT 203 is provided to the input of the circuit. The input signal IN may comprise a high voltage or voltage spikes. The input protection circuit operates to protect circuitry, such as the A/D converters on DAQ board 210 and the computer system 220, from high voltages and/or voltage spikes.

The input protection circuit includes an optocoupler 402 which receives the IN signal. The optocoupler used is preferably a photo MOSFET (metal-oxide semiconductor field-effect transistor). A photo MOSFET is desired and/or required due to its low resistance and current limiting feature, high breakdown voltage and linear resistance properties. In the preferred embodiment, the optocoupler 402 is a high voltage solid state relay optocoupler. The optocoupler 402 functions both as a switch and a current limiter. The optocoupler 402 is capable of protecting up to 400 volts and operates to limit the input current to only a few hundred milliamps. The optocoupler 402 is preferably the IL356 high voltage solid state relay optocoupler produced by Siemens corporation. For more information on the Siemens IL356 optocoupler, please see the Siemens IL356 optocoupler preliminary data sheet, page 5–114, which is hereby incorporated by reference.

The optocoupler 402 provides its output to a measurement system. The measurement system preferably includes an instrumentation amplifier 412, preferably a programmable gain instrumentation amplifier (PGIA). In the preferred embodiment, the instrumentation amplifier 412 is the NI-PGIA programmable gain instrumentation amplifier produced by National Instruments Corporation. The PGIA 412 provides its output to an A/D (analog-to-digital) converter, which converts the analog signals to digital signals. The A/D converter is preferably comprised on DAQ board 210. The digital signals may then be provided to computer system 220. The measurement system preferably comprises one or more of the instrumentation amplifier 412, A/D converters on DAQ board 210, and computer system 220.

A resistor 414 is preferably connected in parallel with the optocoupler 402. The resistor preferably has a large value. The resistor 414 is included to provide the computer system 220 with the ability to monitor and record the signal being measured after the optocoupler 402 has been cut off. The output or anode of a diode 416, preferably a zener diode, is coupled to the output of the optocoupler 402. The cathode of zener diode 416 connects to the input of a comparator 422. The input of comparator 422 also connects to a diode 418, which connects to ground. A resistor 420 is also connected to the input of comparator 422 and connects in parallel with the diode 418. The comparator 422 provides an output to a disable input of the optocoupler 402.

The diode 418 protects the voltage to 0.7 volts. For example, if the zener diode 416 is a 10 volt zener diode, the voltage at the input of the PGIA 412 must be a minimum of 10.7 volts before the zener diode 416 conducts current. Both the zener diode 416 and the diode 418 operate to protect the PGIA 412 from high voltages When the zener diode 416 conducts current, the comparator 422 measures the current and/or voltage being provided through the optocoupler 402. When the current and/or voltage exceeds a preset threshold, the comparator 422 generates a signal to the disable input of the optocoupler 402 to turn off the optocoupler 402. This operates to protect the optocoupler 402 from being damaged if an over-voltage condition occurs. As discussed in the background section, one problem with prior art input protection circuits which use current limiting devices is that, if the amount of voltage that can be protected for is exceeded, referred to as an over-voltage condition, the current limiting device is damaged and thus no longer usable. The present invention provides an improved input protection circuit which also protects the current limiting device from damage if an over-voltage condition is detected, but still allows the input signal to be measured.

When the optocoupler 402 is turned off, the signal being measured is now provided through the resistor 414 instead of the optocoupler 402. Thus the measurement system is still able to record and/or measure the input signal, even after the optocoupler 402 has been shut off. When optocoupler 402 is mined off and the signal being measured passes through the resistor 414 instead of the optocoupler 402, the signal being measured is now provided through a 100 Kohm resistance, i.e., through the resistor 414, instead of through a 10 ohm resistance, i.e., through the optocoupler 402.

In one embodiment, when the comparator 422 generates a signal to turn off the optocoupler 402, the comparator 422 also generates an interrupt to the computer system 220 to indicate that this condition has occurred. The interrupt informs the computer system that the signal being measured is now being provided through a much larger resistance, and thus some degradation can be expected. In other words, the interrupt informs the computer system 220 that the signal being measured is now being provided through a 100 Kohm path instead of a 10 Ohm path.

As an example of the operation of the present invention, when a high voltage is provided to the input protection circuit 400, the circuit 400 (the optocoupler 402) limits the current to a couple of hundred milliamps. Thus when the optocoupler 402 receives a large voltage, such as 400 volts, the current limiting optocoupler 402 performs its current limiting function to conduct only a few hundred milliamps. The optocoupler 402 is only able to withstand such a condition, i.e., withstand this amount of power, for a very limited time, such as a few milliseconds or less. Thus, for the first couple of hundred microseconds the optocoupler 402 will limit the current to 200 to 300 milliamps. A current of 200–300 milli-Amps at a voltage of up to 400 Volts equals 120 Watts of power. Since the optocoupler 402 conducts only a few hundred mA's, even at 400 Volts, the zener diode is only required to absorb this low current, which equals a few Watts of power, for the short time duration until the current is disrupted.

In performing this current and/or voltage limiting function, the optocoupler 402 can become heated. The comparator detects this condition and operates to shut off the optocoupler 402 when this condition is detected. Thus the optocoupler 402 operates to protect against high currents during the initial approximately 200 microseconds until it is shut off. The optocoupler 402 is shut off to protect the optocoupler 402 from damage. The optocoupler 402 is mined back on when the current and/or voltage goes below the comparator threshold. After the optocoupler 402 is turned back on, the optocoupler operates normally.

There are generally two measures of the quality of an input protection circuit, these being the added resistance and the amount of voltage protection. A first measure of the quality of an input protection circuit is the resistance added to the connection path by the input protection circuit. It is desirable for an input protection circuit to provide minimal resistance to the path in which it is connected. If the input protection circuit adds a large amount of resistance to the path, this limits the bandwidth and linearity of the circuit due to the nonlinear capacitance added from the input amplifier. The input protection circuit of the present invention provides a very small amount of resistance, approximately 10 ohms, during normal use. During an over-voltage condition, the input signal is still measured, but a larger resistance is applied to the path of the signal.

A second measure of the quality of an input protection circuit is the amount of voltage that the input protection circuit is capable of protecting for before the protection breaks down. As discussed above, the input protection circuit provides protection up to a certain limit using the optocoupler 402. Before this limit is exceeded, i.e., before an over-voltage condition occurs, the optocoupler 402 is shut off to protect the optocoupler 402 from damage, and the resistor 414 then provides a current limiting function. Thus the input protection circuit of the present invention provides enhanced protection over prior art devices.

FIG. 4—Flowchart Diagrams

Figure 4A:
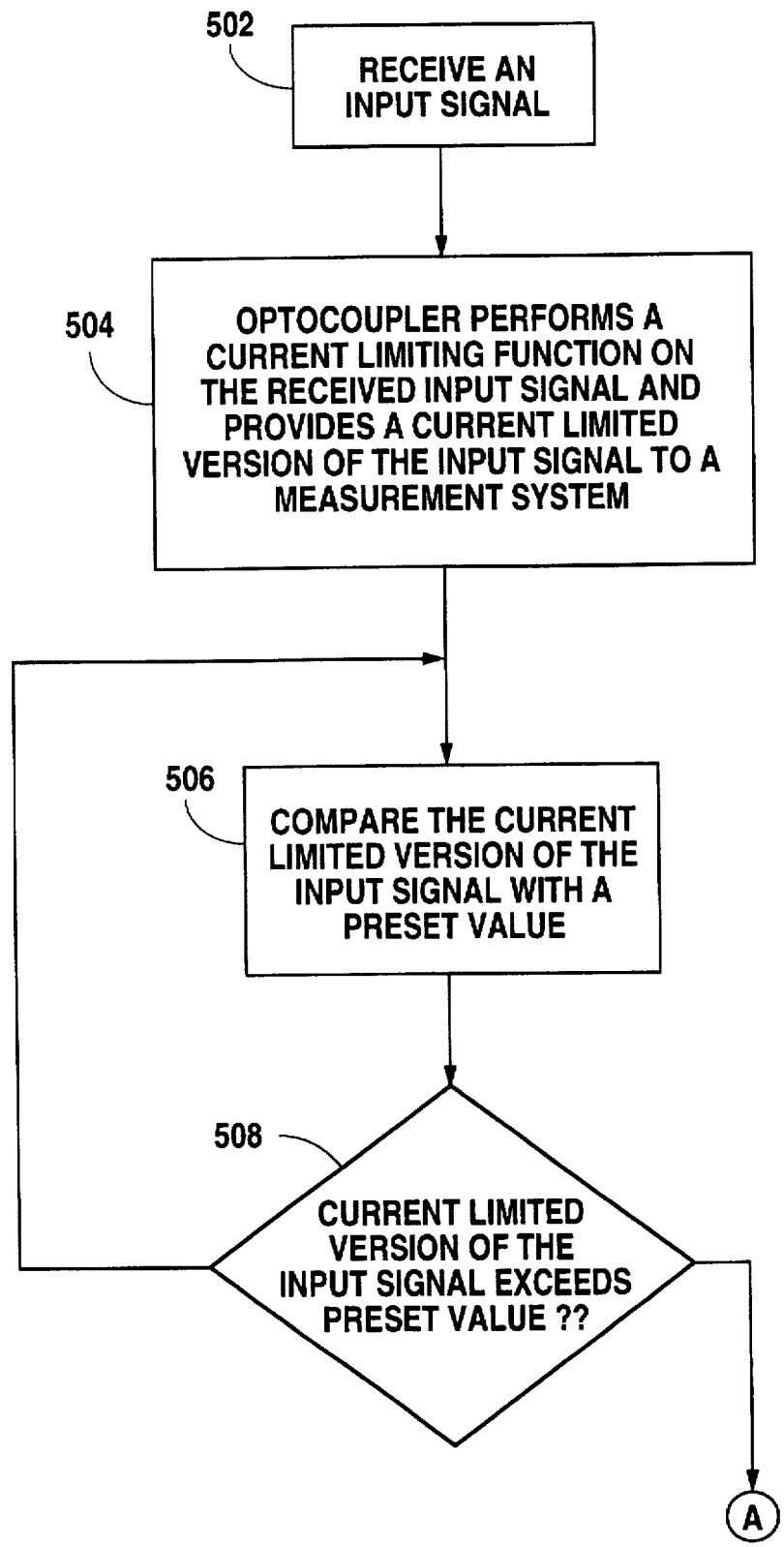
FIGS. 4A and 4B are flowchart diagrams illustrating operation of the present invention.
Figure 4B:
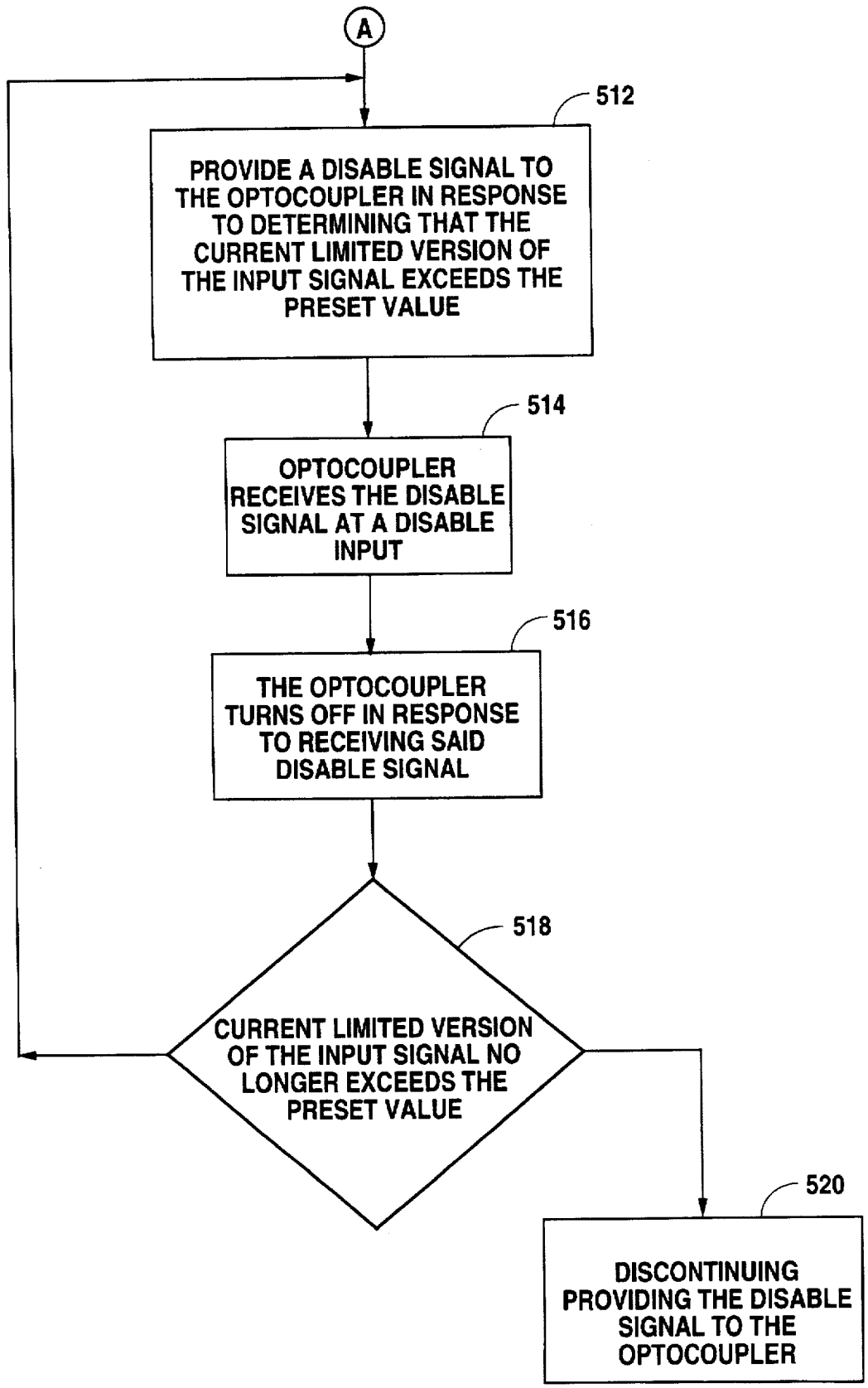

Referring now to FIGS. 4A and 4B, flowchart diagrams illustrating operation of the present invention is shown. FIGS. 4A and 4B illustrate a method for providing input voltage/current protection for a circuit. As shown, in step 502 the method involves receiving an input signal. In step 504 the optocoupler or photo MOSFET 402 performs a current limiting function on the received input signal and providing a current limited version of the input signal to the measurement system. In step 506 the method compares the current limited version of the input signal to determine if the current limited version of the input signal exceeds a preset value.

If in step 508 the current limited version of the input signal exceeds the preset value, then in step 512 (FIG. 4B) the method provides a disable signal to the photo MOSFET 402. The photo MOSFET 402 receives the disable signal at a disable input in step 514 and turns off in step 516 in response to receiving the disable signal. As noted above, during the time that the photo MOSFET 402 is turned off, the measurement system is still able to record the signal through the high impedance resistor 414.

If the current limited version of the input signal is determined to no longer exceed the preset value in step 518, then in step 520 the method discontinues providing the disable signal to the photo MOSFET 402. The photo MOSFET 402 then turns on in response to the disable signal no longer being provided.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

I claim:

1. An input protection circuit which receives an input signal and which is adapted for providing a current limited version of the input signal to a measurement system, comprising:
    an optocoupler including an input for receiving the input signal, wherein the optocoupler provides a current limiting function, wherein the optocoupler includes an output for providing a current limited version of the input signal, wherein the optocoupler further includes a disable input, wherein the optocoupler turns off when the disable input receives a signal;
    a comparator including an input coupled to the output of the optocoupler which receives the current limited version of the input signal, wherein the comparator is operable to provide an output to the disable input of the optocoupler when the current limited version of the input signal exceeds a preset value;
    wherein the output to the disable input of the optocoupler is operable to turn off the optocoupler when the current limited version of the input signal exceeds the preset value.

2. The input protection circuit of claim 1, further comprising a first diode coupled between the output of the optocoupler and the input of the comparator, wherein the first diode operates to limit the value of the signal provided to the measurement system.

3. The input protection circuit of claim 2, wherein the first diode is a zener diode.

4. The input protection circuit of claim 2, further comprising a second diode coupled between the input of the comparator and ground, wherein the second diode operates to limit the value of the signal provided to the measurement system.

5. The input protection circuit of claim 4, further comprising a resistor connected in parallel with the second diode, wherein the resistor is coupled between the input of the comparator and ground, wherein the resistor operates to limit the value of the signal provided to the measurement system.

6. The input protection circuit of claim 1, further comprising a resistor connected in parallel with the optocoupler, wherein a first end of the resistor is connected to the input of the optocoupler and a second end of the resistor is connected to the output of the optocoupler;
    wherein the resistor connected in parallel with the optocoupler provides a high resistance path for the input signal when the optocoupler is turned off.

7. The input protection circuit of claim 1, wherein the comparator is operable to turn on the optocoupler when the current limited version of the input signal no longer exceeds the preset value.

8. The input protection circuit of claim 1, wherein the optocoupler is a high voltage solid state relay optocoupler.

9. The input protection circuit of claim 1, wherein the comparator is adapted to generate an interrupt signal to the measurement system when the current limited version of the input signal exceeds the preset value.

10. The input protection circuit of claim 1, wherein the optocoupler comprises a photo MOSFET.

11. An instrumentation system for measuring an input signal, comprising:
    a transducer for sensing a physical phenomena and generating a corresponding input signal;
    an input protection circuit which receives the input signal and which is adapted for providing a current limited version of the input signal the input protection circuit comprising:
        an optocoupler including an input for receiving the input signal, wherein the optocoupler provides a current limiting function, wherein the optocoupler includes an output for providing a current limited version of the input signal, wherein the optocoupler further includes a disable input, wherein the optocoupler turns off when the disable input receives a signal;
        a comparator including an input coupled to the output of the optocoupler which receives the current limited version of the input signal, wherein the comparator is operable to provide an output to the disable input of the optocoupler when the current limited version of the input signal exceeds a preset value;
        wherein the output to the disable input of the optocoupler is operable to turn off the optocoupler when the current limited version of the input signal exceeds the preset value;
    a measurement system which receives the current limited signal and performs analysis on the current limited signal.

12. The instrumentation system of claim 11, wherein the input protection circuit further comprises a first diode coupled between the output of the optocoupler and the input of the comparator, wherein the first diode operates to limit the value of the signal provided to the measurement system.

13. The instrumentation system of claim 12, wherein the input protection circuit further comprises a second diode coupled between the input of the comparator and ground, and a resistor connected in parallel with the second diode, wherein the second diode and the resistor operate to limit the value of the signal provided to the measurement system.

14. The instrumentation system of claim 11, wherein the input protection circuit further comprises a resistor connected in parallel with the optocoupler, wherein a first end of the resistor is connected to the input of the optocoupler and a second end of the resistor is connected to the output of the optocoupler;

wherein the resistor connected in parallel with the optocoupler provides a high resistance path for the input signal when the optocoupler is turned off.

15. The instrumentation system of claim 11, wherein the comparator comprised in the input protection circuit is operable to turn on the optocoupler when the current limited version of the input signal no longer exceeds the preset value.

16. The instrumentation system of claim 11, wherein the optocoupler comprised in the input protection circuit is a high voltage solid state relay optocoupler.

17. The instrumentation system of claim 11, wherein the comparator comprised in the input protection circuit is adapted to generate an interrupt signal to the measurement system when the current limited version of the input signal exceeds the preset value.

18. The instrumentation system of claim 11, wherein the optocoupler comprises a photo MOSFET.

19. A method for providing input voltage/current protection for a circuit, the method comprising:

receiving an input signal;

a photo MOSFET performing a current limiting function on the received input signal and providing a current limited version of the input signal to a measurement system;

comparing the current limited version of the input signal to determine if the current limited version of the input signal exceeds a preset value;

providing a disable signal to the photo MOSFET in response to determining that the current limited version of the input signal exceeds the preset value;

the photo MOSFET receiving the disable signal at a disable input; and the photo MOSFET turning off in response to receiving said disable signal.

20. The method of claim 19, further comprising:

discontinuing providing the disable signal to the photo MOSFET in response to determining that the current limited version of the input signal no longer exceeds the preset value, wherein said discontinuing operates to turn on the photo MOSFET when the current limited version of the input signal no longer exceeds the preset value.

* * * * *

UNITED STATES PATENT AND TRADEMARK OFFICE
CERTIFICATE OF CORRECTION

PATENT NO. : 5,734,261

DATED : March 31, 1998

INVENTOR(S) :
Niels Knudsen

It is certified that error appears in the above-indentified patent and that said Letters Patent is hereby corrected as shown below:

In the Claims:

Claim 19, col. 10, line 22, please delete "taming" and substitute "turning".

Signed and Sealed this

Fourteenth Day of July, 1998

Attest:

BRUCE LEHMAN

Attesting Officer     Commissioner of Patents and Trademarks